(12) United States Patent
Yagi

(10) Patent No.: US 6,414,476 B2
(45) Date of Patent: Jul. 2, 2002

(54) CURRENT DETECTING DEVICE, IMPEDANCE MEASURING INSTRUMENT AND POWER MEASURING INSTRUMENT

(75) Inventor: Kazuyuki Yagi, Ko-be (JP)

(73) Assignee: Agilent Technologies, Inc., Palo Alto, CA (US)

(*) Notice: Subject to any disclaimer, the term of this patent is extended or adjusted under 35 U.S.C. 154(b) by 9 days.

(21) Appl. No.: 09/764,773

(22) Filed: Jan. 17, 2001

(30) Foreign Application Priority Data

Jan. 18, 2000 (JP) ........................................ 2000-009082

(51) Int. Cl.⁷ .............................................. G01R 19/00
(52) U.S. Cl. ....................................................... 324/127
(58) Field of Search ................................. 324/126, 127, 324/117 R

(56) References Cited

U.S. PATENT DOCUMENTS 4,310,724 A * 1/1982 Gonzalez ..................... 179/18
4,616,174 A * 10/1986 Jorgensen ................ 324/117 R
4,866,373 A * 9/1989 Harada et al. ............... 324/127
5,345,182 A 9/1994 Wakamatsu .................. 324/649
5,463,323 A 10/1995 Wakamatsu .................. 324/611
6,018,238 A * 1/2000 Shafie ...................... 324/117 R

* cited by examiner

Primary Examiner—Michael J. Sherry
Assistant Examiner—Roshni Kurian

(57) ABSTRACT

To perform broadband current detection. The current detector of the present invention comprises first terminal, which receives power source current; second terminal, which feeds output current to an outside current; third terminal, which outputs pilot current having a predefined relationship with this output current; and fourth terminal, which has reference potential; as well as first component connected between the first and second terminals; vertical connection of first and second baluns and coupled with the first component; grounded capacitive component at the connecting part of the first and second baluns; and grounded capacitive component at the output part of the second balun. The properties of the instrument for measuring impedance and the apparatus for measuring power are improved by using the current detector of the present invention.

10 Claims, 3 Drawing Sheets

CURRENT DETECTING DEVICE, IMPEDANCE MEASURING INSTRUMENT AND POWER MEASURING INSTRUMENT

FIELD OF THE INVENTION

The present invention pertains to electrical measurements in general and in particular, to a broadband current detector and an instrument for measuring impedance and apparatus for measuring power that uses the same.

BACKGROUND OF THE INVENTION

Current measurement is a basic measurement and measurement of current flowing through floating lines is widely used. There are also many cases where, besides simply measuring current, current is measured as one of several measurements of physical and chemical quantities other than electricity including measurements of quantities related to power and impedance.

The method whereby the current to be measured is introduced through a balanced-to-unbalanced transformer (referred to below as a balun), such as transformer coupling, etc., to a current detector or voltage detector, which are unbalanced apparatuses, has been used for resultant determination of current with said current detector or voltage detector. However, ideal transformer coupling cannot be used for determinations of current within a wide frequency range of, for instance, 1 MHz to 1 GHz, so that a transmission path-type balun with relatively good frequency properties is used.

A transmission path-type balun is made, for instance, by coiling a coaxial line around a ferrite core, with one terminal pair of said coaxial line serving as the pair of input terminals and the other terminal pair serving as the pair of output terminals. The coupling coefficient of the center conductor and the sheath of the coaxial line are very close to 1 and therefore, excellent frequency properties are achieved. There is a reduction in applied voltage to the component to be measured due to self-inductance of the balun and therefore, as a means for preventing this, the coaxial line is coiled around the ferrite core in order to increase self-impedance and alleviate said reduction. For instance, an example of the use of a transmission path-type balun is given in Japanese Kokai Patent No. 9[1997]-318671.

FIG. 1 is a simplified circuit diagram of an instrument for measuring impedance that is a preferred example of using a current detector that uses this type of transmission path-type balun. Complex impedance Zx of the component to be measured 18 is determined as the vector ratio (v1/i1) of current i1 flowing through said component 18 and voltage v2 applied across said component 18. Incidentally, the current flowing through capacitor 34 and the current flowing through another parasitic impedance will have an effect on i1, but these currents are disregarded in the description of the present invention to simplify the description. Direct-current power source 12 and alternating current power source 10, power source resistance 14, direct-current detection resistance 16 and component to be measured 18 are connected in-series. Current detection resistance 16 is such that the pair of input terminals of transmission path-type balun 20 represents the end. One pair of the output terminals of balun 20 is direct-current coupled with the terminal on the power source resistance 14 side of current detection resistance 16 via balun 20 and coupled to reference potential point 4 (often has ground potential) via capacitor 24. The other pair of output terminals of balun 20 is direct-current coupled with the terminal on side of current detection resistance 16 of the component to be measured 18 via balun 20 and coupled to reference potential point 4 via capacitor 30 and resistance 32.

Apparatus for measuring voltage 36 measures voltage V1 that is produced between the terminals of resistance 32 by current i1, which has been introduced to resistance 32 via balun 20, and determines the value of current i1. Moreover, the voltage v1 between the terminals of component to be measured 18 is measured by apparatus for measuring voltage 38 via capacitor 34 and measurement V2 is obtained. Impedance Zx=v1/1 of component to be measured 18 is obtained by multiplying a predefined coefficient A by ratio V2/V1 of measurements V2 and V1. Power consumption in the component to be measured 18 is obtained by multiplying a predefined B by a product of V2 and V1. The ratio between current i2 to i1 that produces voltage V1 and i1 must be stabilized for stability of coefficients A and B after the calibration for measurements. The reason why this stability is lost is that there are changes in the values of the component to be measured as well as fluctuations in balun properties due to changes in temperature, etc.

The ratio between currents i1 and i2 in FIG. 1 is calculated by the following formula:

$$i1/i2 = -\{(R1+R2+Zc3)/R2\} \times N1/N2 \qquad \text{(Formula 1)}$$

Here, $N1=\{1+Zc1/(R1+R2+Zc3)+(Zc1/Z1)\times(R3+Zc3)/(R1+R2+Zc3)\}$, $N2=\{1-(Zc1/Z1)\times(Zx/R2)\}$ and R1, R2 and R3 are the resistance values of resistance's 14, 16, and 32, respectively; Zc1 and Zc3 are the impedance values of capacitors 24 and 30, respectively, and Zx and Z1 are the impedance value of component to be measured 18 and the self-impedance value of balun 20, respectively.

The self-inductance of the above-mentioned transmission path-type coaxial balun is dependent on the magnetic permeability of the ferrite core and therefore, is unstable with changes in temperature. Therefore, an attempt will be made to investigate the effect of the value Z1 of self-impedance on current ratio i1/i2. The denominator in formula 1 becomes a function of impedance Zx of the object to be measured and therefore, the case where the impedance of the component to be measured is 500Ω will be studied as an example. First, a capacitor and resistance are used, whose temperature coefficient of the component values less than 100 ppm/°C. can be easily obtained, and therefore, changes in the impedance of these components can be disregarded. However, the self-impedance of the balun is dependent on the magnetic permeability of the core that is used in this balun and therefore, is about 0.5%/°C. The absolute self-impedance value of the balun changes by 10% with a change in temperature of 20° C.

When typical impedance values (R1=R2=R3=50Ω, Zc1=Zc3=-j0.5) Ω, Zx=500Ω, Z1=j100Ω; (here, j is an imaginary number) are substituted in above-mentioned (formula 2), it is clear that a change of 0.5% is produced in the value of i1/i2 with a change of 10% in self-inductance Z1 of the balun. This type of change can lead directly to errors in measurements of impedance.

While, it is clear that when Zc1=0 (that is, when C1 is reduced), N1=0 and N2 does not =0 then and changes in the value of i1/i2 are not produced with a change in self-impedance Z1 of the balun. However, direct current cannot be applied to the component to be measured with a structure wherein Zc1=0.

Although the case where 500Ω is the impedance Zx of component to be measured 18 was studied here, the change in i1/i2 when 500Ω is replaced by 50Ω becomes approximately 0.1%. Thus, this amount of change in i1/i2 is greatly dependent on the value of the component to be determined and measurement errors will increase therefore so-called 3-point correction may not be correctly performed. Moreover, temperature correction is also dependent on the absolute self-impedance of the balun and is not realistic.

SUMMARY OF THE INVENTION

The object of the present invention is to provide a current detector with which alternating current can be detected with stability over a broad band, even if direct current has been added.

Another object of the present invention may be to present a high-precision instrument for measuring impedance that uses this current detector.

Yet another object of the present invention may be to present an apparatus for measuring power that uses this current detector.

The main structure of the present invention is given below:

A first embodiment of the present invention is a current detector, comprising a first terminal, which receives power source current; a second terminal, which feeds output current to an external device; a third terminal, which outputs monitor current having a predefined relationship with said output current; a fourth terminal having reference potential; a first component connected between the first and second terminals, a first balun, which comprises the first and second terminals as a first pair of input terminals and has a first pair of output terminals connected by a first line to the above-mentioned first pair of input terminals: a second balun, which comprises the above-mentioned first pair of output terminals as a second pair of input terminals and has a second pair of output terminals connected by a second line to the above-mentioned second pair of input terminals: a first capacitive component, which is connected between one output terminal of the above-mentioned first pair of output terminals having direct-current coupling with the above-mentioned first terminal and the above-mentioned fourth terminal; and a second capacitive component, which is connected between one of the output terminals of the above-mentioned second pair of output terminals having direct-current coupling with the above-mentioned first terminal and the above-mentioned fourth terminal, wherein the other output terminal of the above-mentioned second pair of output terminals having direct-current coupling with the above-mentioned second terminal serves as the third terminal.

The above-mentioned first component can be a resistance component.

At least one of the above-mentioned first and second baluns can be a balun wherein at least one circuit corresponding to the above-mentioned first and second circuits is coiled around a ferrite core.

Furthermore, at least one of the above-mentioned first and second lines can be a coaxial line.

By means of the present invention, only one coaxial line is used for both the above-mentioned first and second lines.

The above-mentioned first terminal may have a direct-current coupling with the outer conductor of the above-mentioned coaxial line.

In addition, the current detector further comprises an apparatus for measuring current connected to the third terminal, with which current is received from the above-mentioned third terminal and measurements corresponding to the above-mentioned pilot current are provided.

The above-mentioned apparatus for measuring current may have a third capacitive component having one terminal connected to the third terminal, an input resistance component connected between the other terminal of the above-mentioned third capacitive component and the fourth terminal, and an apparatus for measuring voltage, which is coupled with the above-mentioned input resistance component and is for measuring the voltage produced at the above-mentioned input resistance component.

In addition, the present invention gives an instrument for measuring impedance comprising the above-mentioned current detector, a voltage detector connected between the above-mentioned second and fourth terminals, which provides measurements in accordance with voltage produced between the above-mentioned second and fourth terminals, and a control and computation means, which calculates measurements related to the impedance to be measured between the above-mentioned second and fourth terminals from the measurement corresponding to the above-mentioned voltage and the measurement corresponding to the above-mentioned current.

The present invention provides an apparatus for measuring power comprising the above-mentioned current detector, a voltage detector connected between the above-mentioned second and fourth terminals, which provides measurements in accordance with the voltage produced between the above-mentioned second and fourth terminals, and a control and computation means, which calculates measurements related to the power consumed by the component to be measured between the above-mentioned second and fourth terminals from the measurement corresponding to the above-mentioned voltage and the measurement corresponding to the above-mentioned current.

The other details of the invention and the results of the same can be easily understood from the following description in the present Specification.

DEFINITION OF THE SYMBOLS

Figure 1:
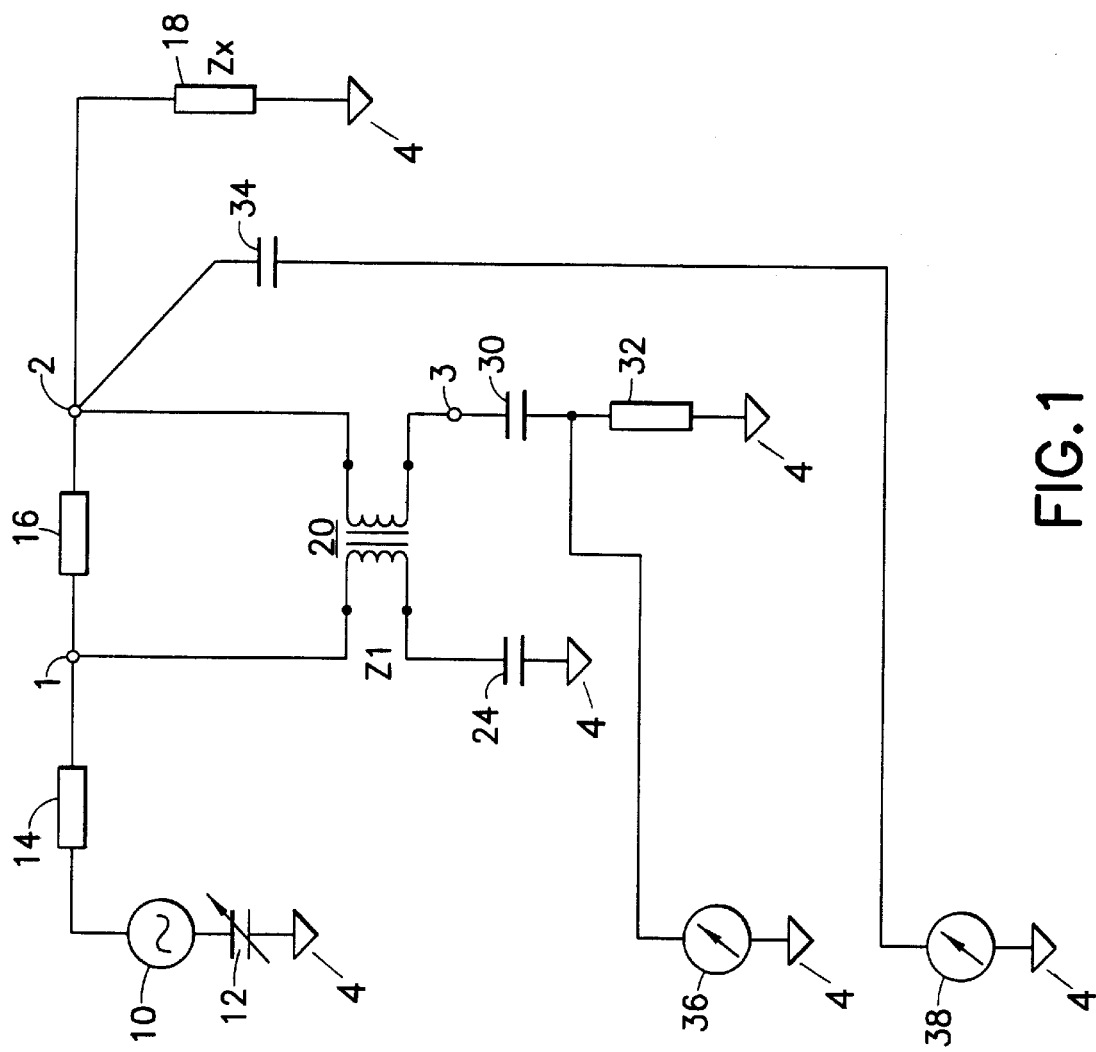
FIG. 1 is a circuit diagram of an instrument for measuring impedance comprising a conventional current detector related to the present invention.

100: composite apparatus
104: terminal
106: output terminal
116, 132: resistance
118: component to be measured
120, 122: balun
130: capacitive component
136, 138: apparatus for measuring voltage
140: control apparatus

DETAILED DESCRIPTION OF THE INVENTION

Figure 3:
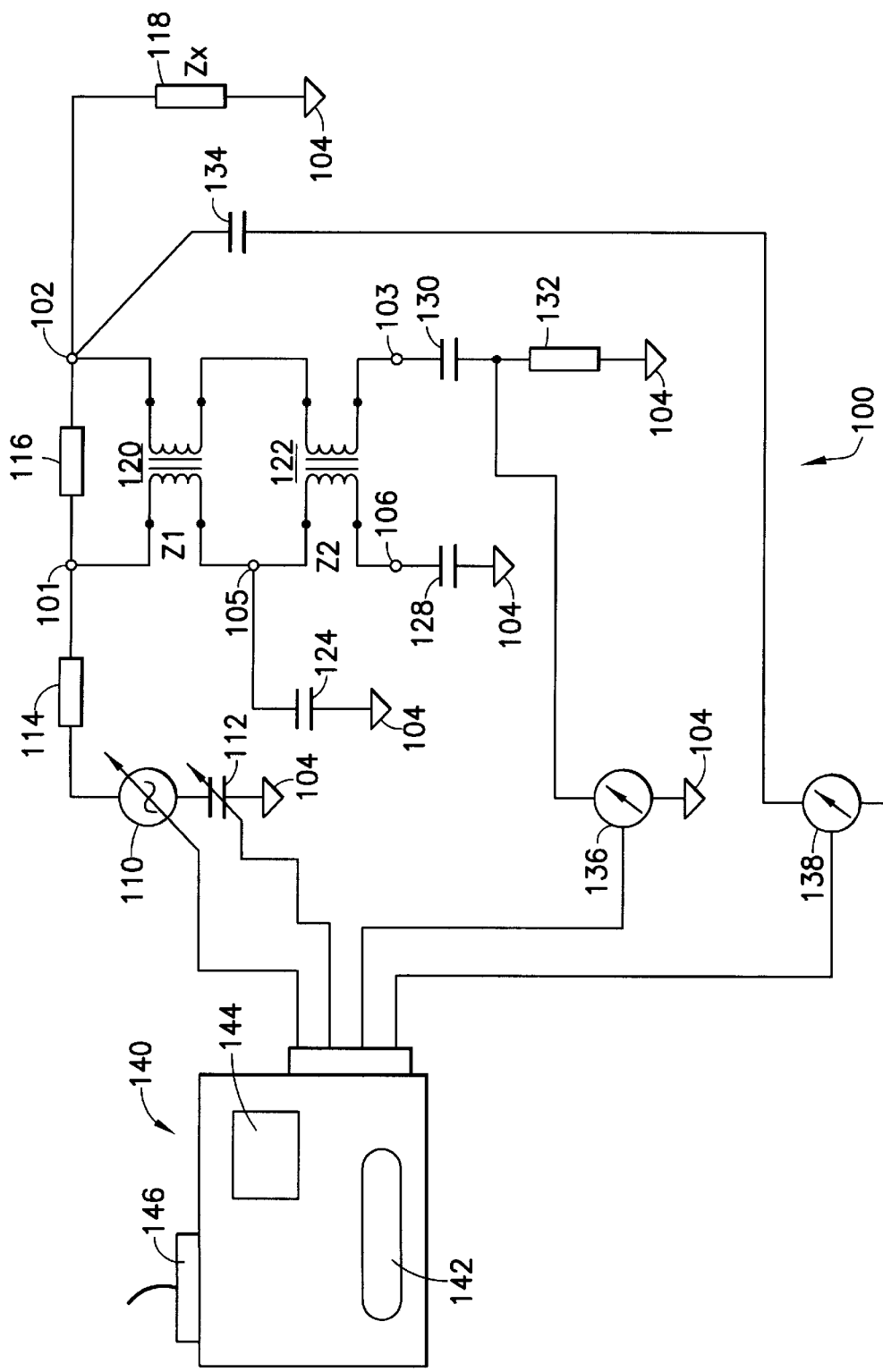
FIG. 3 is a circuit diagram of a composite apparatus for describing the present invention.

The technical concept behind the current detector, the instrument for measuring impedance, and the apparatus for measuring power will be clearly described while referring to FIG. 3. An example of the current detector of the present invention and the general structure of an example of a combined device that uses this current detector and functions as an instrument for measuring impedance and an apparatus for measuring power are shown in FIG. 3.

Combined device 100 in FIG. 3 is substantially the same as the instrument for measuring impedance in FIG. 1 with the exception of transmission path-type balun 122 and capacitive component 128 and control apparatus 140. Incidentally, each device of the present invention is capable of broadband measurement of 1 MHz over 1 GHz.

Direct-current power source 112 for giving direct-current bias to component to be measured 118, which can be an external circuit, and alternating current power source 110 for generating alternating-current signals for measuring alternating-current impedance, power source resistance 114, current detection resistance 116, and component to be measured 118 are connected in-series. Current detection resistance 116 is such that the pair of input terminals (101, 102) of transmission path-type balun 120 is terminated. One of the pair of output terminals of balun 120 is direct-current coupled with terminal 101 on the power-source resistance 114 side of current detection resistance 116 via balun 120 and coupled with reference potential point 104 (often has ground potential and) via capacitor 124, as well as coupled with input terminal 105 of one of the pair of input terminals of second balun 122. The other of the pair of output terminals of balun 120 is direct-current coupled with terminal 102 on the side of the component to be measured 118 side of current detection resistance 116 via balun 120 and coupled to the other terminal of the pair of input terminals of second balun 122. One terminal 106 of the pair of output terminals of balun 122 is direct-current coupled with one input terminal 105 of balun 120 via balun 122 and coupled to reference potential point 104 via capacitor 128. The other terminal 103 of the pair of output terminals of second balun 122 is coupled with reference potential point 104 via capacitor 130 and resistance 132.

The apparatus for measuring voltage 136 measures the voltage produced between the terminals of resistance 132 by current i2 that has flowed into resistance 132 via second balun 122 and determines voltage measurement V1 for determining current i1 that will flow to component to be measured 118. Moreover, voltage v1 between the terminals of component to be measured 118 is measured by apparatus for measuring voltage 138 via capacitor 134 and measurement V2 is obtained.

Control apparatus 140 sets direct-current power source 112 and alternating-current power source 110 in accordance with the desired measurement conditions input from manual input part 142 or remote input part 146, or read-out from an internal memory, and reads measurements V1 and V2 of voltages V1 and V2 from apparatuses for measuring voltage 136 and 138.

When control apparatus 140 is constructed so that it functions as an instrument for measuring impedance, control apparatus 140 then multiplies predefined function A1 by ratio V2/V1 of measurements V2 and V1 in order to find value Zx=v1/i1 of impedance of component to be measured 118. When necessary, Zx, which is the result of the same calculation, is displayed on display 144 as with a conventional instrument for measuring impedance.

Power consumed by the component to be measured is given as i1×v2 by multiplying predefined coefficient B1 by product ratio V2×V1 of measurements V2 and V1. The ratio of current i2 that produces voltage V1 to i1 must be stabilized for stability of correcting coefficients A1 and B1 after calibration thereof for measurements. The reason why this stability is also lost with the current detector of the present invention is that changes occur in the values of the component to be measured as well as fluctuations in balun properties due to changes in temperature, etc.

As with calculations for finding i1/i2 in the comparative example in FIG. 1, the calculations will be performed for the case where the impedance of component to be measured 118 is 500Ω The symbols in (formula 1) will be used in the same type of formula.

Figure 2A:
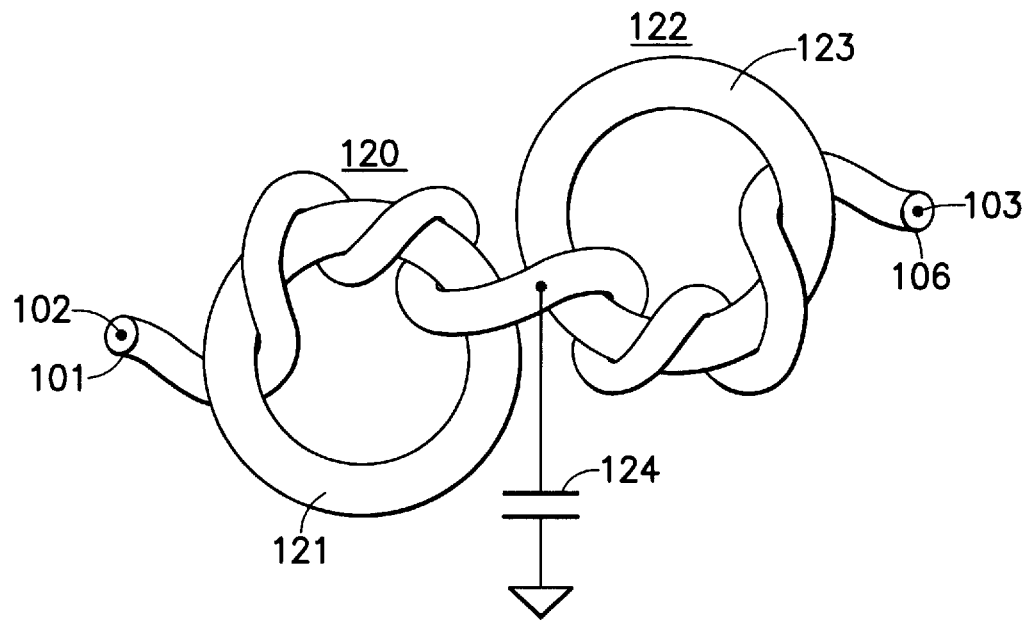
FIG 2A is a structural diagram of an example of a balun having two cores used in the present invention.
Figure 2B:
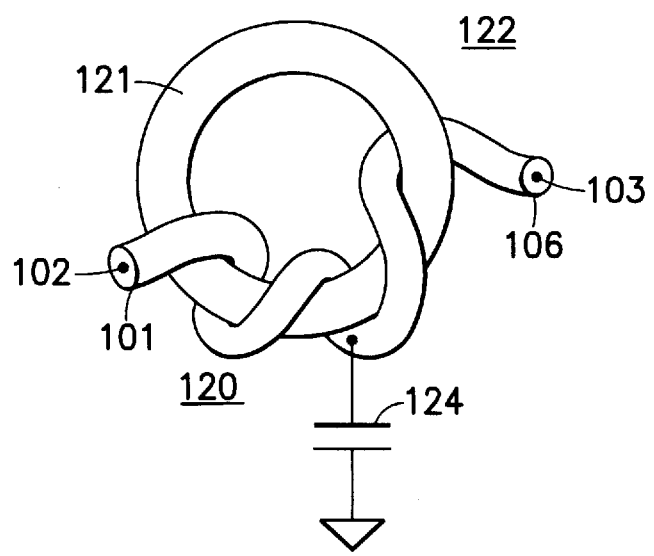
FIG. 2B is a structural diagram of an example of a balun having one core used in the present invention.

The ratio between currents i1 and i2 in FIG. 2 is calculated by the following formula:

$$i1/i2 = -\{(R1+R2+Zc3)/R2\} \times N1/N2 \qquad \text{(Formula 2)}$$

Here, $N1 = \{1+Zc1+Zc2)/Z2+Zc1/Z1+Zc2/(R1+R2+Zc3)+(Zc1/Z1) \times Zc2/Z2) \times (R1+Zc3+Z1+Z2)/(R1+R2+Zc3)\}$, $N2 = \{1+(Zc1+Zc2)/Z2+Zc1/Z1-(Zc1/Z1) \times (Zc2/Z2) \times (Zx/R2)\}$ and R1, R2 and R3 are the resistance values of resistance's 114, 116, and 132, respectively; Zc1, Zc2, and Zc3 are the impedance values of capacitors 124, 128, and 130, respectively; and Zx, Z1, and Z2 are the impedance value of component to be measured 118 and the self-impedance value of balun 120 and the self-impedance value of balun 122, respectively.

The self-inductance of the above-mentioned transmission path-type coaxial balun is dependent on the magnetic permeability of the ferrite core and therefore, is unstable with [changes in] temperature. Therefore, an attempt will be made to investigate the effect of values Z1 and Z2 of self-impedance on the current ratio i1/i2. The denominator in formula 2 becomes a function of the impedance Zx of the object to be measured and therefore, the case where impedance of the component to be measured is 500Ω will be studied as an example.

When typical impedance values (R1=R2=R3=50Ω, Zc1=Zc2=Zc3=−j0.5Ω, Zx=500Ω, Z1=Z2=j100Ω; (here, j is an imaginary number) are substituted in above-mentioned formula 2, it is clear that a change of 0.05% is produced in the value of i1/i2 with a change of 10% in self-inductance values Z1 and Z2 of the balun.

Moreover, it is clear that the above-mentioned change is 0.048% when Zx is 50Ω, and the i1/i2 is more stable to changes in Zx when compared to the current detector in FIG. 1. This type of change can lead directly to errors in measurements of impedance. However, it is ¹⁄₁₀ the changes with the device in FIG. 1. Incidentally, this error can be further reduced by reducing capacity Zc2 of capacitor 128.

The absolute value of impedance Zc1 of the capacitor must be brought to 0.05Ω in order to expect the same results as with the current detector in FIG. 1. In calculations it is possible to realize this low impedance within a wide frequency range, but it proves difficult with an actual capacitor. For instance, a capacity of 3.2 uF is needed to bring [impedance] to 0.05Ω at 1 MHz. On the other hand, the parasitic-series inductance component of the capacitor itself must be brought to approximately 8 pH in order to bring [impedance] to 0.05Ω at 1 GHz. An actual small capacitor has an inductance of several hundred pH and therefore, many capacitors are needed even when arranged in parallelism, then which is unrealistic. Moreover, when the capacity of the capacitor is high, the response of the device will be slow and measurement speed will be reduced with respect to the level of changes in the direct-current voltage and the alternating-current signals, which is undesirable.

Although a capacitor of 3.2 uF is needed with the conventional current detector in FIG. 1, a capacity of 0.64 uF is enough with composite apparatus 100 of the present invention in FIG. 2. The composite apparatus of the present example is also advantageous from this point of view.

Balun 120 and balun 122 can be a twisted pair of wires, a coaxial line, or such wires or lines coiled around a magnetic core (also referred to as the core). However, it is preferred that a coaxial line be coiled around a magnetic core, such as a ferrite core, in order to guarantee broadband performance. A ferrite core will improve low-band performance and will prevent marked resonance by loss of the same in the high band. The number of coil turns can be from a fraction of times to several times, depending on the magnetic core. An example of this type of structure is shown in FIG. 2(A). Coaxial lines (101, 102; 103, 106) are coiled around cores 121 and 123. Moreover, when the balun is made so that capacitors 124 and 128 (not illustrated) are connected to outer conductors (101, 106) of the coaxial line, the connection will be made easily, which is preferred. Moreover, one coaxial line can be used by both baluns, as in FIG. 2(A), or separate lines can be used. There are also cases where the same core 121 can be used by both baluns, making it possible to reduce the number of cores (FIG 2 (B)). The combination of baluns and grounded capacitors can be cascaded vertically in multiple stages, such as 3 stages, etc., to further improve the results.

In the above-mentioned example, j 100Ω served as the self-impedance Z1 of balun 120. However, this value is dependent on value R1 of signal source resistance 114 in FIG. 3 and the extent to which a reduction in applied voltage is controlled. In the case of a 50Ω system, a balun self-impedance of j 50Ω is necessary in order to attenuate the signal level to 3 dB or less. In this case, it is preferred that impedance Zc1 of capacitor 124 be Z1/50 or less within the frequency range that is used. Impedance Zc2 of balun 122 and capacitor 128 can also be the same as that of balun 114 and capacitor 124.

As previously explained, the following results are the main effects obtained when the present invention is used:

By using the structure of the invention, it may be possible to feed direct-current bias to an external circuit and obtain a pilot current having a predefined relationship with the output alternating current within a broad band. Moreover, a first capacitive component of low capacity is used, even within the same alternating-current band, when compared to conventional devices, and therefore, direct-current bias can be changed at a faster speed. Moreover, the circuit scale of the device can also be reduced.

The above-mentioned first component may be a resistance component and broadband current detection is performed At least one of the above-mentioned first and second baluns comprises a ferrite core and therefore, the band of the balun is broad and resonance hardly occurs. Therefore, high-frequency detection of current over a broadband is possible.

Moreover, at least one of the above-mentioned first and second lines can be a coaxial line and therefore, balun properties are improved and current detection over a broader band is possible.

Furthermore, the first and second lines may be the same single coaxial line and therefore, balun properties further improved and a current detector that costs less is obtained, because the means for cutting and coupling the coaxial line is omitted.

The above-mentioned first terminal can be direct-current coupled with the outer conductor of the above-mentioned coaxial line and therefore, the capacitive component can be coupled with the outer conductor. This plays a role in supplying operation and in reducing current detector cost.

There may also be an apparatus for measuring current that gives a measurement corresponding to the above-mentioned pilot current and therefore, it can be used to display this measurement and calculate other values.

By means of the present invention, pilot current can be transformed to unbalanced voltage and this voltage is measured with a simple structure and therefore, broadband precision current measurement is conducted easily.

In addition, by means of the instrument for measuring impedance, the current flowing to the component to be measured is determined and the impedance to be measured is measured from these results using the above-mentioned current detector of the present invention. This structure is used and therefore, it is possible to apply direct-current bias over a broad band and to measure components to be measured, one by one.

By means of the apparatus for measuring power, it is possible to measure the current of an outside circuit using the above-mentioned current detector and therefore, it is possible to measure only the alternating current consumed by an outside circuit over a broad band.

Moreover, there are cases where the differences between the structure of the power source and the outside circuit are not substantial and the outside circuit has a power generator such as a cell or an oscillator in the description of the present invention. Moreover, the present invention can be used even in cases where current that should be measured with an outside circuit is generated.

The other inventions and their results can most likely be easily understood from the above-mentioned entire description of the present Specification.

What is claimed is:

1. A current detector, comprising:
   a first terminal, which receives power source current;
   a second terminal, which feeds external device to an outside current;
   a third terminal, which outputs pilot current having a predefined relationship with said output current;
   a fourth terminal having reference potential;
   a first component connected between the first and second terminals;
   a first balun, which comprises the first and second terminals as a first pair of input terminals and has a first pair of output terminals connected by a first line to said first input pair of terminals;
   a second balun, which comprises said first pair of output terminals as a second pair of input terminals and has a second output pair of terminals connected by a second line to said second pair of input terminals,
   a first capacitive component, which is connected between one output terminal of said first pair of output terminals having direct-current coupling with said first terminal and said fourth terminal; and
   a second capacitive component, which is connected between one of the output terminals of said second pair of output terminals having direct-current coupling with said first terminal and said fourth terminal,
   wherein the other output terminal of said second pair of output terminals having direct-current coupling with said second terminal serves as the third terminal.

2. A current detector according to claim 1, wherein said first component is a resistance component.

3. A current detector according to claim 1, wherein at least one of said first and second baluns is a balun where at least the one circuit to corresponding said first and second circuits is coiled around a ferrite core.

4. A current detector according to claim 1, wherein at least one of said first and second lines is a coaxial line.

5. A current detector according to claim 4, wherein only one coaxial line is used for both said first and second lines.

6. A current detector according to claim 4, wherein said first terminal has a direct-current coupling with the outer conductor of said coaxial line.

7. A current detector according to claim 2, further comprising:
   an apparatus for measuring current connected to the third terminal, with which current is received from said third terminal and measurements corresponding to said pilot current are provided.

8. A current detector according to claim 7, wherein said apparatus for measuring current has a third capacitive component having one terminal connected to the third terminal, and an input resistance component connected between the other terminal of said third capacitive component and the fourth terminal, and an apparatus for measuring voltage, which is coupled with said input resistance component and is for measuring the voltage produced at said input resistance component.

9. An instrument for measuring impedance, comprising:
   a current detector according to claim 7;
   a voltage detector connected between said second and fourth terminals, which provides measurements in accordance with voltage produced between said second and fourth terminals; and
   a control and computation means, which calculates measurements related to the impedance to be measured between said second and fourth terminals from the measurement corresponding to said voltage and the measurement corresponding to said current.

10. An apparatus for measuring power, comprising:
    a current detector according to claim 7;
    a voltage detector connected between said second and fourth terminals, which provides measurements in accordance with the voltage produced between said second and fourth terminals; and
    a control and computation means, which calculates measurements related to the power consumed by the component to be measured between said second and fourth terminals from the measurement corresponding to said voltage and the measurement corresponding to said current.

* * * * *